United States Patent [19]
Sosa

[11] Patent Number: 5,521,933
[45] Date of Patent: May 28, 1996

[54] BACKMATCHED LASER DIODE DRIVER

[75] Inventor: Martin G. Sosa, Carson City, Nev.

[73] Assignee: Hytek Microsystems, Inc., Carson City, Nev.

[21] Appl. No.: 399,768

[22] Filed: Mar. 7, 1995

[51] Int. Cl.⁶ .................................................. H01S 3/00
[52] U.S. Cl. ............................. 372/38; 372/34; 333/32
[58] Field of Search ................................ 372/38, 34, 43; 333/32

[56] References Cited

U.S. PATENT DOCUMENTS

| | | | |
|---|---|---|---|
| 4,032,865 | 6/1977 | Harp et al. | 333/21 R |
| 4,379,273 | 4/1983 | Bender | 333/32 |
| 4,834,491 | 5/1989 | Aoki et al. | 350/96.20 |
| 4,876,484 | 10/1989 | Mitchell et al. | 315/94 |
| 5,107,230 | 4/1992 | King | 333/32 |
| 5,287,022 | 2/1994 | Wilsher | 307/542 |

Primary Examiner—Leon Scott, Jr.
Attorney, Agent, or Firm—Noel F. Heal

[57] ABSTRACT

Apparatus, and a related method for its operation, for isolating a semiconductor laser diode physically and thermally from a drive circuit used to generate large modulating currents applied to the laser diode. Bias and modulating currents generated by the drive circuit are transmitted to the laser diode over a selected length of transmission line, such as a coaxial cable. Generation of heat close to the laser diode is minimized by a backmatching technique in which impedance matching is effected entirely at the drive circuit end of the transmission line. An impedance matching the characteristic impedance of the transmission line is connected across the line at the drive circuit end, allowing modulation currents to be transmitted to the laser diode without distortion.

6 Claims, 12 Drawing Sheets

BACKMATCHED LASER DIODE DRIVER

BACKGROUND OF THE INVENTION

This invention relates generally to high power semiconductor laser diodes and, more particularly, to semiconductor laser diode drive circuits or drivers. Semiconductor laser diodes are widely used in a variety of applications. The present invention pertains specifically to semiconductor laser diodes of the type used in optical communication in space and in research laboratory applications. Devices of this general type are typically driven at high modulation currents, of approximately 200 mA peak-to-peak, and high data rates, such as 600 Mbit/s (megabits per second). In a communications application, the semiconductor laser diode is biased by a relatively low bias current to produce a low intensity output and is modulated by a data signal that switches the diode back an forth between the low intensity output condition and a high intensity output condition.

Associated with the laser diode is a drive circuit that supplies both a bias current and a modulation current controlled by the data signal. Traditional designs have integrated the laser diode with its driver components. Typically, the laser diode plugs into a socket that is part of a driver assembly. The principal drawback with this approach is that thermal power dissipated by the driver heats up the laser diode, which becomes degraded in spectral purity. Thus the useful life of the laser diode is severely limited.

Although thermo-electric coolers (TECs) have been used to maintain laser diodes at a desired operating temperature, their use is rendered extremely difficult by the close proximity of the heat dissipating laser diode driver. Ideally, designers would like to isolate the laser diode both physically and thermally from its driver, but no-one prior to the present invention has achieved this goal.

SUMMARY OF THE INVENTION

The present invention resides in a laser diode drive system that achieves virtually complete isolation of the laser diode from the heat dissipated by its driver. Briefly, and in general terms, the apparatus of the invention comprises a semiconductor laser diode; a drive circuit, for generating current signals to be applied to the semiconductor laser diode; a transmission line having input terminals to which the drive circuit is connected and output terminals to which the semiconductor laser diode is connected, the transmission line having sufficient length to provide a desired physical separation of the semiconductor laser diode from the drive circuit, and having a characteristic impedance; and a backmatching impedance connected across the input terminals of the transmission line, having an impedance approximately matching the characteristic impedance of the transmission line. Use of the backmatching impedance at the input terminals of the transmission line avoids the location of any heat producing components near the semiconductor laser diode, the temperature of which can then be conveniently controlled. In the apparatus as disclosed by way of illustration, the semiconductor laser diode has a low dynamic impedance of approximately 2–5 ohms in the "ON" state and the transmission line characteristic impedance and the backmatching impedance are each approximately 50 ohms.

More specifically, the drive circuit generates a constant bias current that is sufficient to maintain the semiconductor diode in an "ON" state at all times, and generates a modulating current that is added to the bias current in response to presence of a data signal applied to the drive circuit. In the presently preferred embodiment of the invention, the modulating current is a square wave having a selected radio frequency.

The invention may also be defined as a method for operating a semiconductor laser diode in physical and thermal isolation from its drive circuit, the method comprising the steps of connecting a transmission line of selected characteristic impedance between a drive circuit and a semiconductor laser diode, the transmission line having input terminals connected to the drive circuit and output terminals connected to the semiconductor laser diode; connecting a backmatching impedance between the input terminals of the transmission line, the backmatching impedance having an impedance approximately matching the characteristic impedance of the transmission line; generating bias and modulating currents in the drive circuit; and transmitting the bias and modulating currents along the transmission line to the semiconductor laser diode without significant distortion. The semiconductor laser diode is in this way isolated from sources of heat in the drive circuit but is electrically matched to its drive circuit. The method may also include the step of controlling the temperature of the semiconductor laser diode, to stabilize its operation. Temperature control can be more easily effected because the semiconductor laser diode is physically and thermally isolated from its drive circuit.

It will be appreciated from the foregoing that the present invention represents a significant advance in techniques for driving semiconductor laser diodes, especially at high modulating currents and modulation rates. The invention avoids locating any heat producing components near the laser diode, so that the only significant source of heat is the laser diode itself, and this can be more conveniently controlled when the laser diode is physically separated from the drive circuit components. Various other aspects and advantages of the invention will become apparent from the following more detailed description, taken in conjunction with the accompanying drawings.

BRIEF DESCRIPTION OF THE DRAWINGS

FIG. 5b is a reciprocal version of the circuit of FIG. 5a;

FIGS. 8a and 8b through 14a and 14b are graphs of waveforms derived from other simulations of the apparatus of the present invention under various operating conditions.

DESCRIPTION OF THE PREFERRED EMBODIMENT

Figure 1:
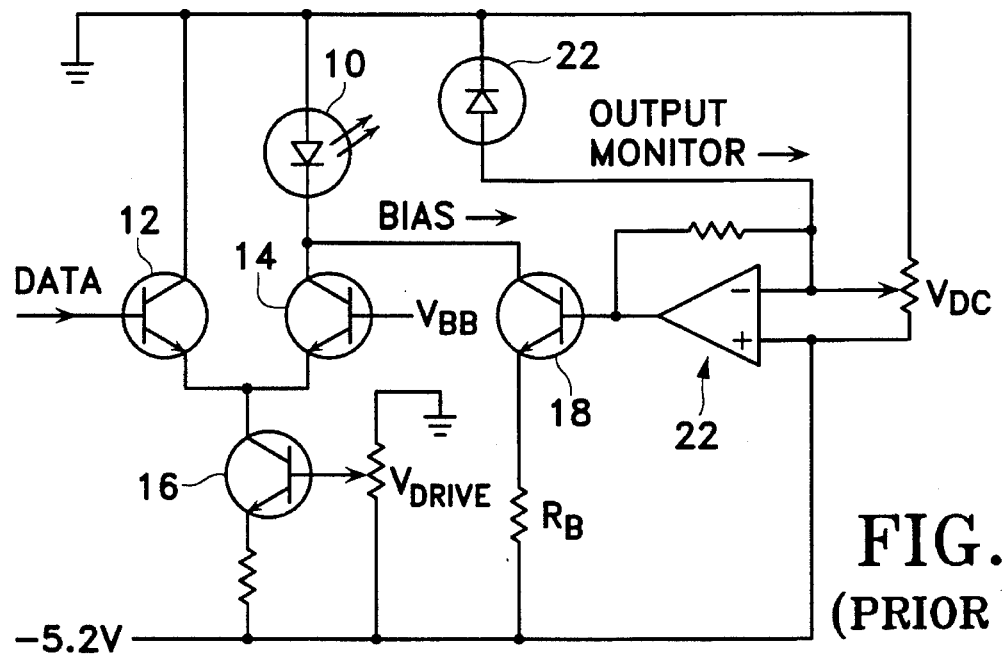
FIG. 1 is a schematic diagram of conventional laser diode drive circuit.

As shown in the drawings for purposes of illustration, the present invention pertains to a drive system for a high current, high switching rate semiconductor laser diode. As will now be discussed in more detail, traditional driver circuits for laser diodes of this general type dissipate a great deal of power in the form of heat.

A typical laser diode and driver of the prior art are shown in FIG. 1, which depicts the laser diode, indicated by reference numeral 10, positioned in close proximity to components of the driver. The driver includes a pair of NPN transistors 12 and 14 with their emitters connected, another NPN transistor 16 providing a source of modulation current, and yet another NPN transistor 18 providing a source of bias current. The modulation current source 16 flows through either transistor 12 or transistor 14, depending on the state of a data signal applied to the base of transistor 12. Normally, the laser diode 10 is biased with a current level that sets it just above its lasing threshold. In effect, the diode is always in the "on" condition, and the modulation current increases the output intensity of the diode in accordance with the state of the data signal. A photoconductive diode 20 can be used to monitor the output of the laser diode 10, and the output of the diode 20 is fed back to an amplifier circuit 22, which dynamically adjusts the bias level of the laser diode 10. The principal drawback of this configuration is that heat dissipated by the drive circuit adversely affects operation of the laser diode 10, because of the intimate contact and proximity of the laser diode. Heating of the laser diode 10 drastically reduces the spectral purity of the diode's light output and severely compromises the life of the device. Moreover, temperature control of the laser diode 10 with thermo-electric coolers is rendered difficult, if not impossible, because of the close proximity of the diode to the source of heat.

Figure 2:
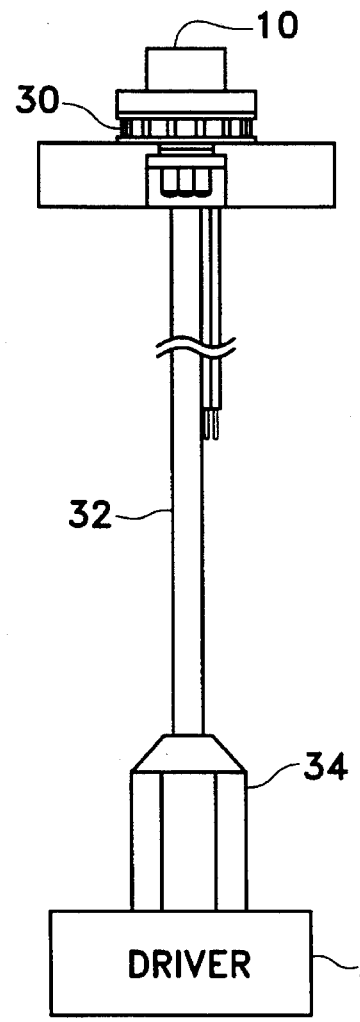
FIG. 2 is a diagrammatic view of laser diode shown in remote relation to its drive circuit in accordance with the invention.

Ideally, solution of this laser diode heating problem requires the laser diode 10 to be physically and thermally isolated from the drive circuit. FIG. 2 shows the concept diagrammatically. The laser diode 10, mounted on a thermo-electric cooler 30, is connected to a coaxial cable 32 having a standard connector 34 that can be plugged into a driver module 36. Unfortunately, however, the inventive concept as described thus far does not achieve the goal of thermal isolation. A further difficulty arises because laser diodes typically have a very low dynamic impedance of around 2–3 ohms in the lasing state. Typical coaxial cable has a characteristic impedance of around 50 ohms. If this impedance mismatch is not resolved, power cannot be efficiently transmitted from the driver 36 to the laser diode 10 and the modulated current waveform is distorted by signal reflections back and forth along the cable 32. Conventional engineering design would address this problem by placing terminating impedance of approximately 47 ohms (50 ohms minus 3 ohms) at the diode end of the coaxial cable 32. The cable 32 would then be properly terminated. However, heat would be dissipated in the terminating impedance, which would necessarily be located in proximity to the laser 10. In effect, physical isolation would be achieved, but not thermal isolation.

In accordance with the invention, a laser diode is both physically and thermally isolated from its driver by a coaxial cable, and no terminating impedance is positioned at the laser diode end of the cable. Instead, impedance matching is effected at the driver end of the cable, using a technique known as backmatching, which will be explained in detail below.

Figure 3A:
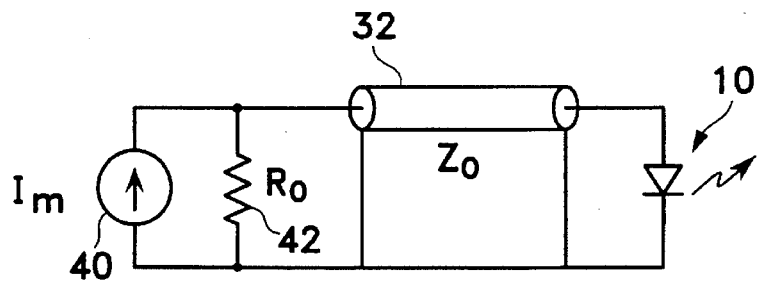
FIG. 3a is a simplified circuit diagram showing the apparatus of the present invention, including the laser diode, drive current generator, coaxial cable transmission line, and backmatching impedance.

The backmatching technique is shown diagrammatically in FIG. 3a. The driver is represented only as a source 40 of modulating current $I_m$. The coaxial cable 32 has a characteristic impedance $Z_0$, which is typically 50 ohms, and the laser diode 10, which is connected to the diode end of the cable, is assumed to have an impedance of 2.5 ohms. An impedance matching resistor 42 with resistance $R_0$ is connected across the current source 40 at the driver end of the cable 32.

Figure 3B:
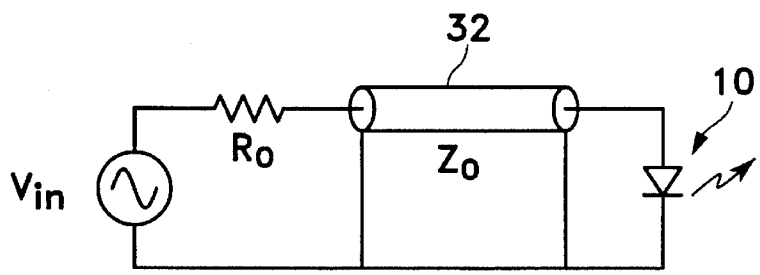
FIG. 3b is a modified form of the circuit diagram of FIG. 3a, with drive current generator and backmatching impedance replaced by a Thévenin equivalent circuit.
Figure 3C:
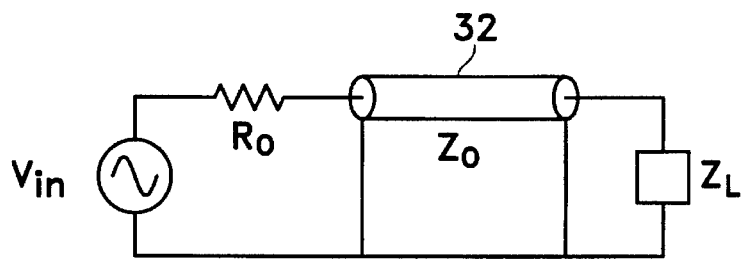
FIG. 3c is a further modified form of the circuit of FIG. 3b, with the laser diode replaced by its dynamic impedance.

In FIG. 3b, the drive current generator 40 and the backmatching impedance 42 of FIG. 3a have been replaced by a Thévenin equivalent circuit. Thévenin's theorem is a well known tool used in network analysis. In effect, the theorem states that one can simplify a circuit connected to two terminals by replacing the circuit with a generator in series with an impedance, where the generator has a voltage equal to the open-circuit voltage measured at the terminals, and the series impedance is obtained by observing the impedance at the terminals when all voltage sources in the circuit are short-circuited and all current sources are open-circuited. In this case, the two terminals are at the driver end of the cable 34. The open-circuit voltage, i.e. the voltage output from the driver with the cable 34 disconnected, is measured as $V_{in}$. The Thévenin equivalent impedance is simply $R_0$, which is the impedance seen looking back into the driver with the current source 40 open-circuited. Thus the Thévenin equivalent circuit is as shown in FIG. 3b. FIG. 3c shows the same equivalent circuit but with the laser diode 10 replaced by its impedance $Z_L$. In the general case, $R_0$ must be chosen to have the same value as the characteristic impedance of the line, i.e. $Z_0$.

The backmatching technique may, at first glance, seem not to achieve the desired matching goal, but can be further explained by treating the transmission line 32 and the laser diode 10 as reciprocal, passive circuit elements, and making use of the theorem of reciprocity for reciprocal networks. The reciprocity theorem may be stated as follows:

"In any linear, time-independent network with independent sources, the ratio of the current in a short circuit at one part of the network to the output of a voltage source at another part of the network does not change if the positions of the source and the short-circuit are interchanged. Reciprocity also applies to a current source and the voltage developed across an open circuit." Electronics Engineers' Handbook (Third Edition), McGraw-Hill Book Company (1989), p. 3–5.

Figure 4A:
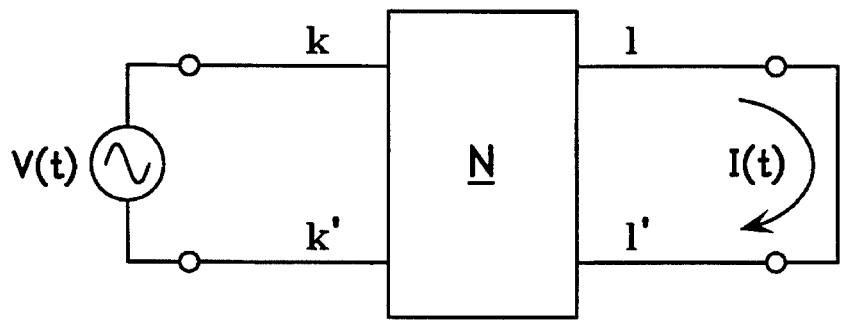
FIGS. 4a and 4b are diagrams illustrating the theorem of reciprocity.
Figure 4B:
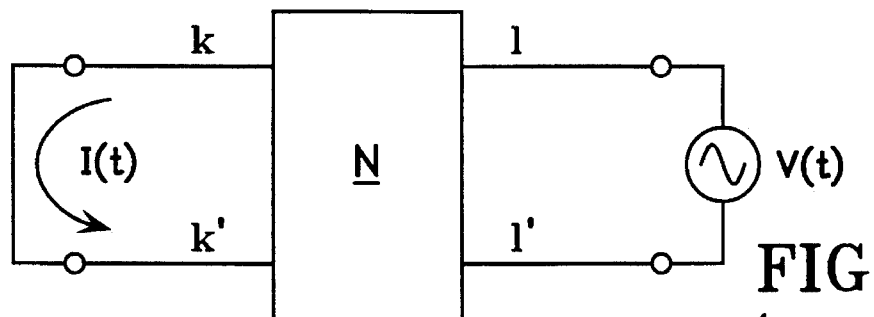

FIGS. 4a and 4b illustrate the theorem of reciprocity in general. N is a two-port reciprocal network. If an input voltage V(t) applied across terminals k-k' results in a current I(t) through a short circuit across terminals 1-1', then the inverse is also true according to the theorem, i.e. a voltage of V(t) applied across terminals 1-1' will result in a current I(t) through a short circuit across terminals k-k'.

Figure 5A:
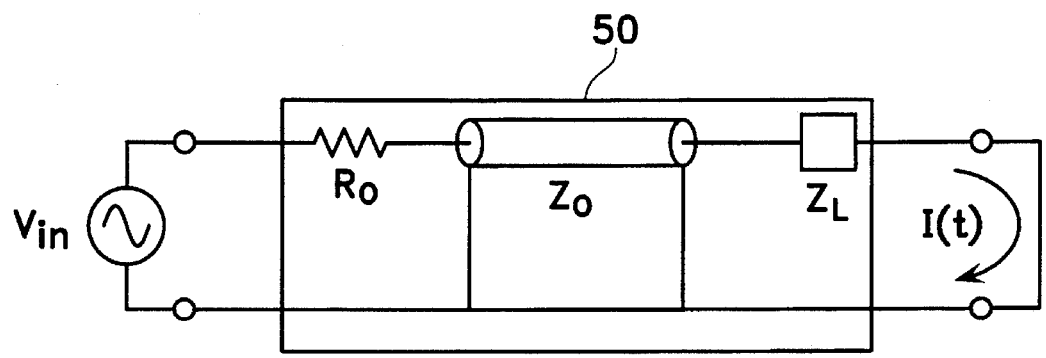
FIG. 5a is the circuit of FIG. 3c with the components rearranged to illustrate application of the theorem of reciprocity.
Figure 5B:
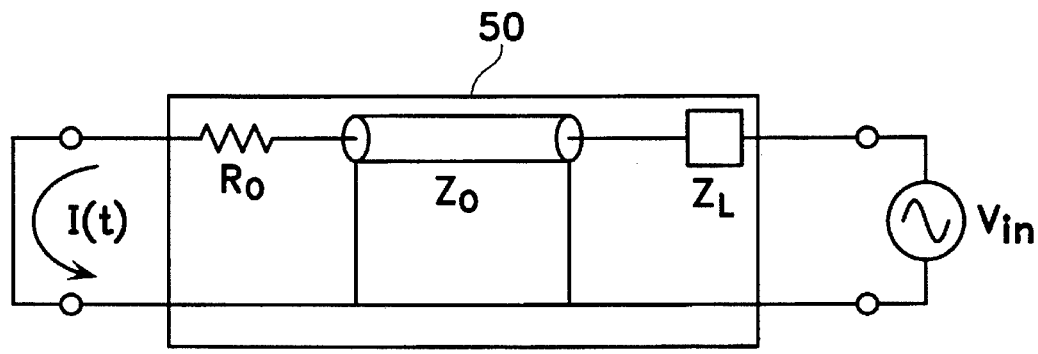

The theorem of reciprocity can be applied to the present invention as shown in FIGS. 5a and 5b. A reciprocal network 50 is defined as including the Thévenin equivalent impedance $R_0$, the coaxial cable 32, and the laser diode impedance $Z_L$ all connected in series. When the Thévenin equivalent voltage $V_{in}$ is applied across the input terminals of this network 50, this results in a current I(t) at the output terminals, i.e. a current of I(t) through the laser diode 10. In accordance with the reciprocity theorem, a voltage $V_{in'}$, applied to the output terminals of the network 50 would result in a short-circuit current of I(t) at the input terminals, as shown in FIG. 5b.

Figure 6:
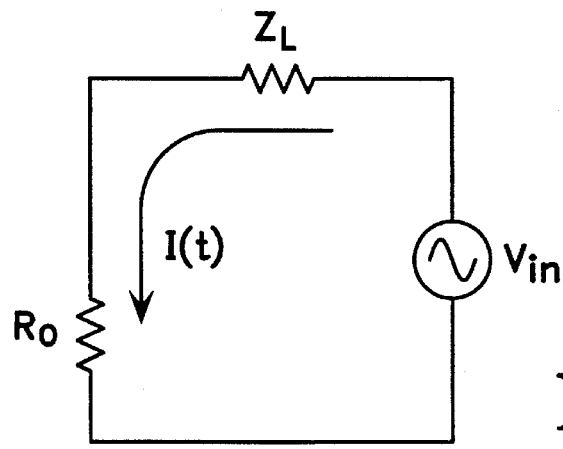
FIG. 6 is an equivalent resistor network derived from the circuit of FIG. 5b.

If $R_0$ properly matches the cable characteristic impedance $Z_0$, the circuit of FIG. 5b can be reduced to the equivalent resistor network of FIG. 6, with the equivalent voltage $V_{in}$ feeding into resistors $Z_L$ and $R_0$ in series. The current I(t) can be calculated as $I(t)=V_{in}/(R_0+Z_L)$, which is the same as the current flowing through the laser diode to provide intensity modulation.

The theorem of reciprocity applies only to two-port, reciprocal networks, and it might be supposed that the theorem is inapplicable to a network that includes a laser diode. A laser diode is not a reciprocal element because it has a high impedance when reverse biased (and in the OFF state) and a low impedance with forward biased (and in the ON state). However, in the present application the laser diode 10 is always in the ON state and its bias current is adjusted to a value slightly above the diode's lasing threshold. Because the laser diode is always in the ON state, it can be modeled as a constant impedance load $Z_L$, which is typically 2–5 ohms.

As the theorem of reciprocity and the Thévenin theorem together show, impedance matching can be achieved by including a matching impedance connected across the input end (the driver end) of the coaxial cable 32, where the matching impedance is selected to match the characteristic impedance of the coaxial cable. The cable 32 or transmission line does not need to be terminated at its output (laser diode) end, and complete thermal isolation is obtained between the laser diode 10 and its driver.

The effectiveness of the backmatching technique was first tested by simulation, using different matching impedances and different input waveforms. Close correlation was obtained between the simulations and actual test results. The following table summarizes the parameters of each simulation and includes references to corresponding figure numbers:

propagate along the transmission line to reach the load $Z_L$. The simulation confirms that, under ideal conditions, the current pulses are transmitted to the laser diode 10 without signal distortion.

The second simulation (FIGS. 8a and 8b) is identical to the first except that a sine wave input signal is used. Again the transmission line output is a faithful reproduction of the input except for the transmission delay.

The third simulation (FIGS. 9a and 9b) is similar to the first except that a 45-ohm matching impedance is used, representing a mismatch of −10%. In the output, the initial transmission delay is still evident, but in addition there is distortion of the output after a full roundtrip delay. The reflected signals cause distortion and standing waves in the transmission line, and the distortions show up as peaking in the output waveform.

The fourth simulation (FIGS. 10a and 10b) is similar to the third one except that the matching impedance is 55 ohms, representing a +10% mismatch. The output signal is distorted as in the case of the −10% mismatch.

The fifth simulation (FIGS. 11a and 11b) shows the effect of a −50% mismatch, with the matching impedance selected at 25 ohms. The reflections caused by the mismatch are immediately noticeable at the output of the transmission line. This type of distorted waveform can severely affect the laser diode. High peak currents in the distorted output can even destroy the laser diode if the peaks extend above some safety threshold.

The sixth simulation (FIGS. 12a and 12b) uses the same parameters as the very first, i.e. a matching impedance of 50 ohms and a square wave input signal at 1 GHz. The difference is that this simulation focuses on the input of the transmission line rather than the output. After a roundtrip propagation delay, the signal at the transmission line input shows the effect of a reflected wave, which is absorbed by the backmatching impedance.

The seventh simulation (FIGS. 13a and 13b) is similar to the last described case except that the input frequency is reduced to 100 MHz and the transmission line input is plotted in the second figure. The transmitted and reflected signals are superimposed at the transmission line input, but the reflected signals are absorbed by the backmatching impedance. Without proper termination, the reflected signals would continue reflecting back and forth, further increasing the distortion.

Figures 7A, 7B:
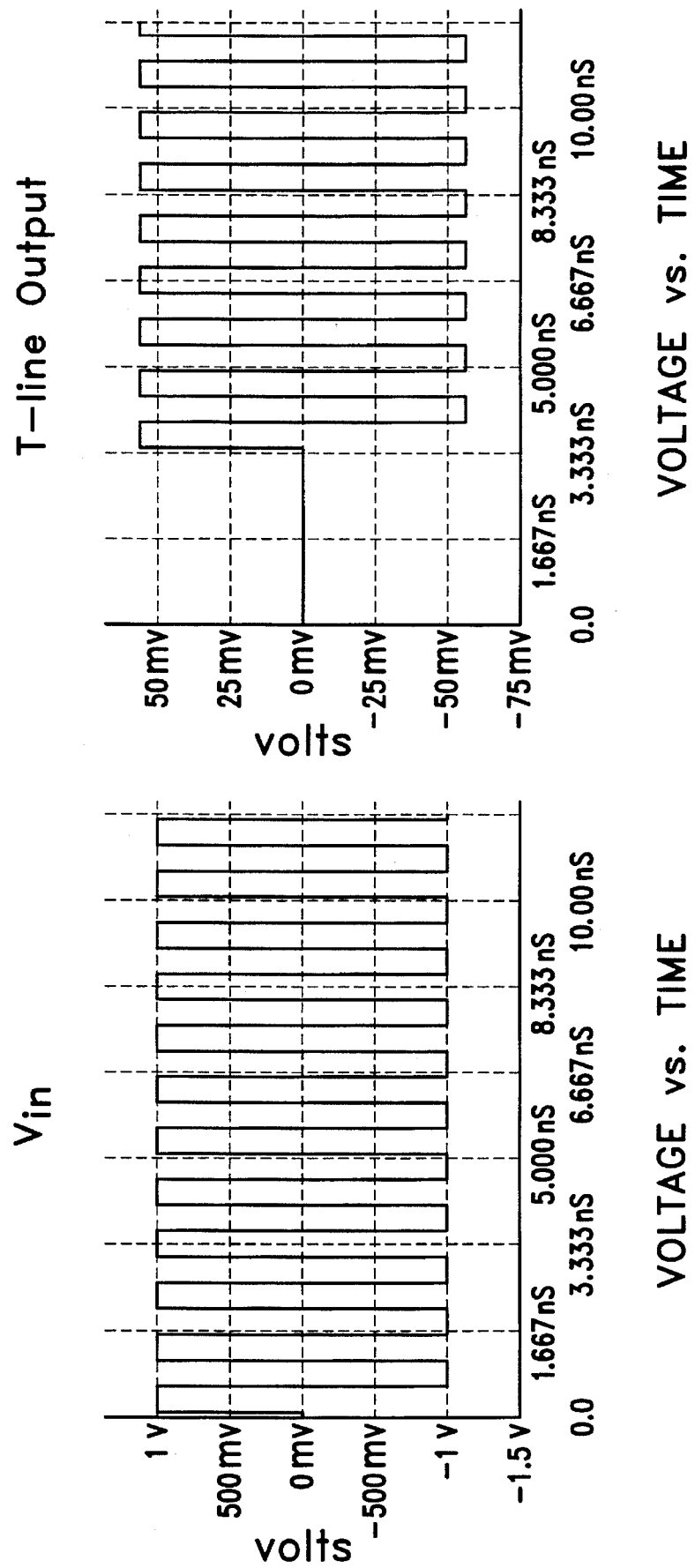
FIGS. 7a and 7b are graphs showing input and output waveforms derived from a simulation of the apparatus of the present invention.
Figures 8A, 8B:
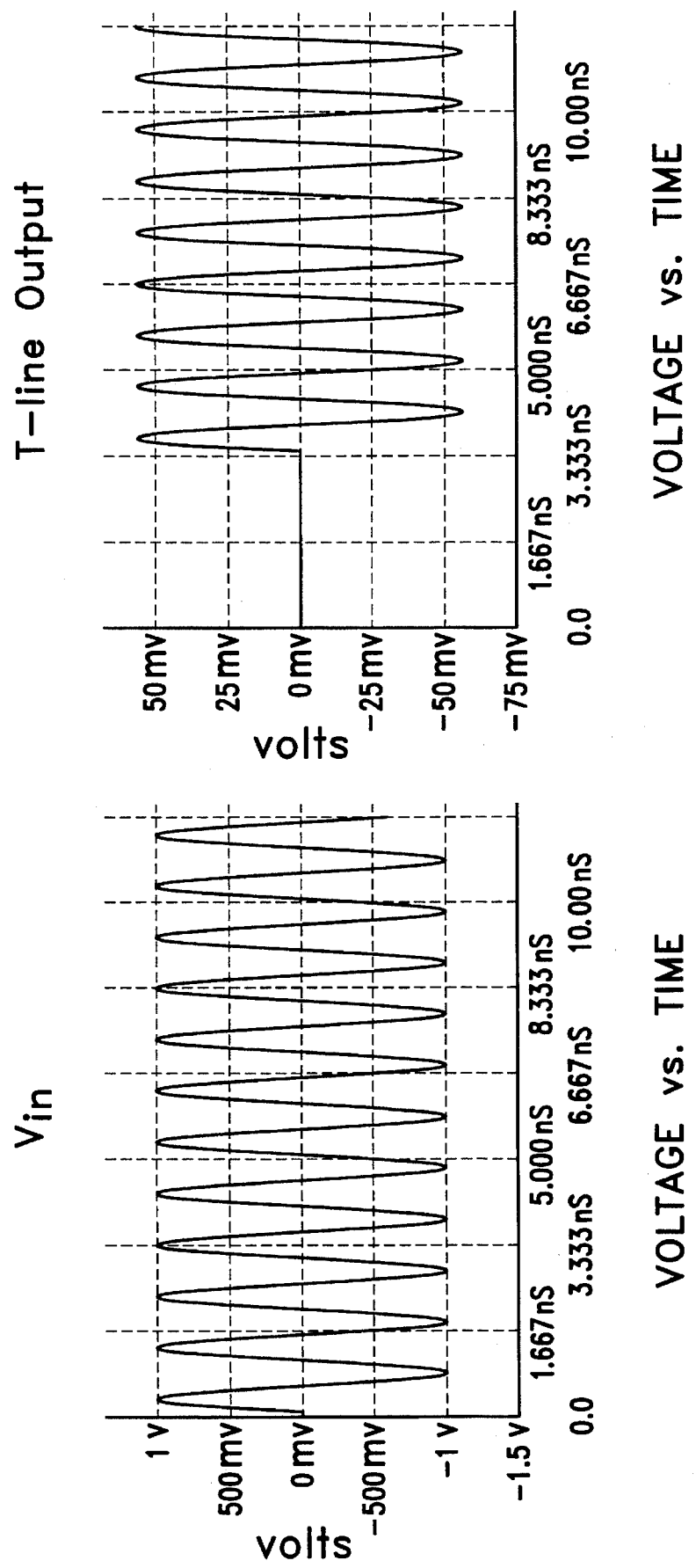
Figures 9A, 9B:
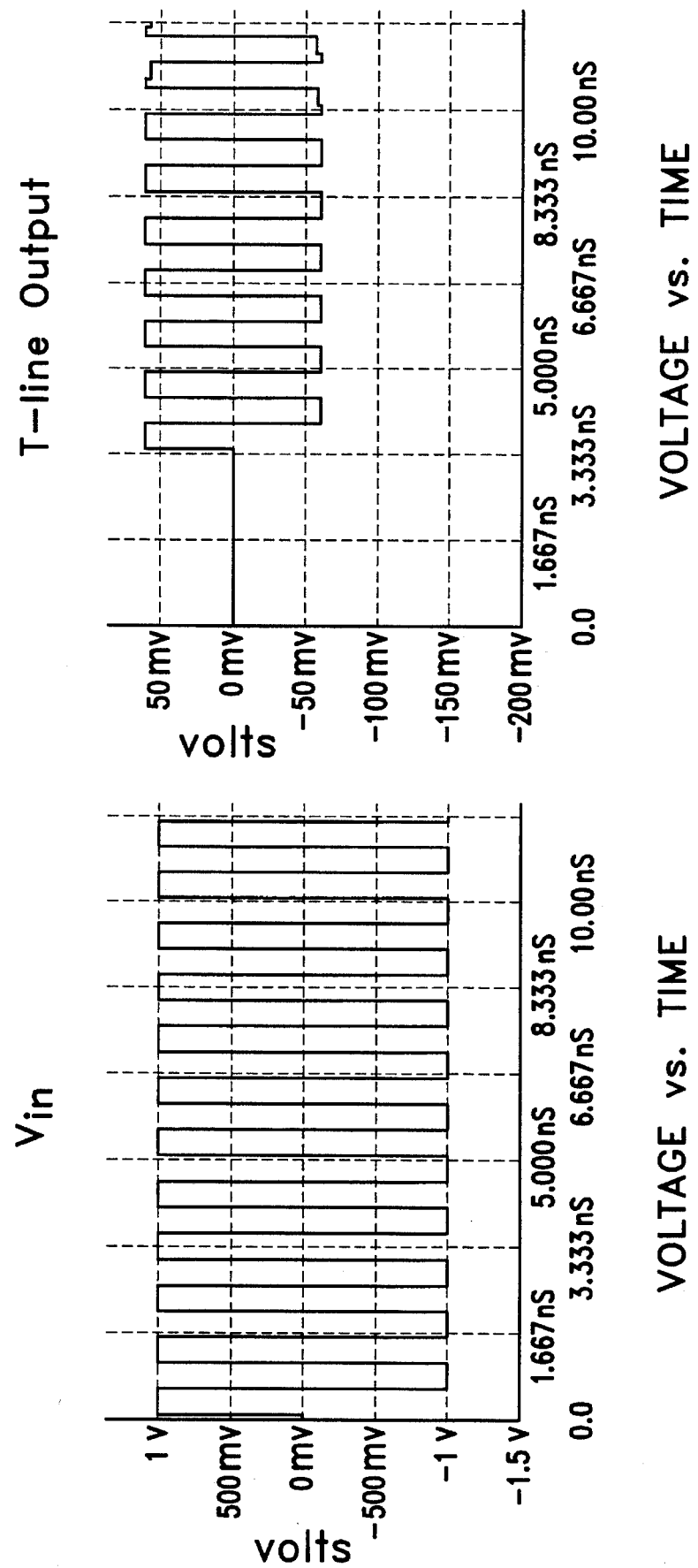
Figures 10A, 10B:
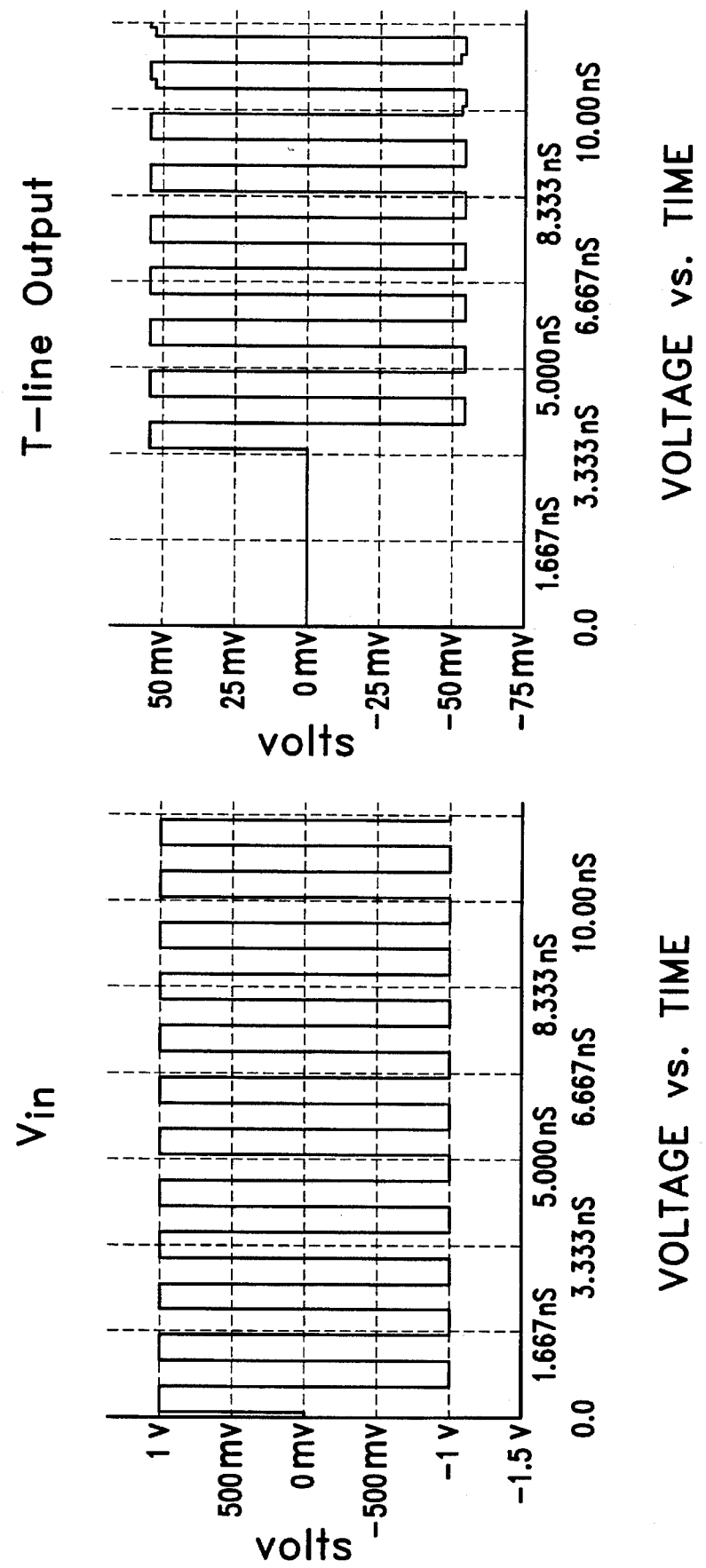
Figures 11A, 11B:
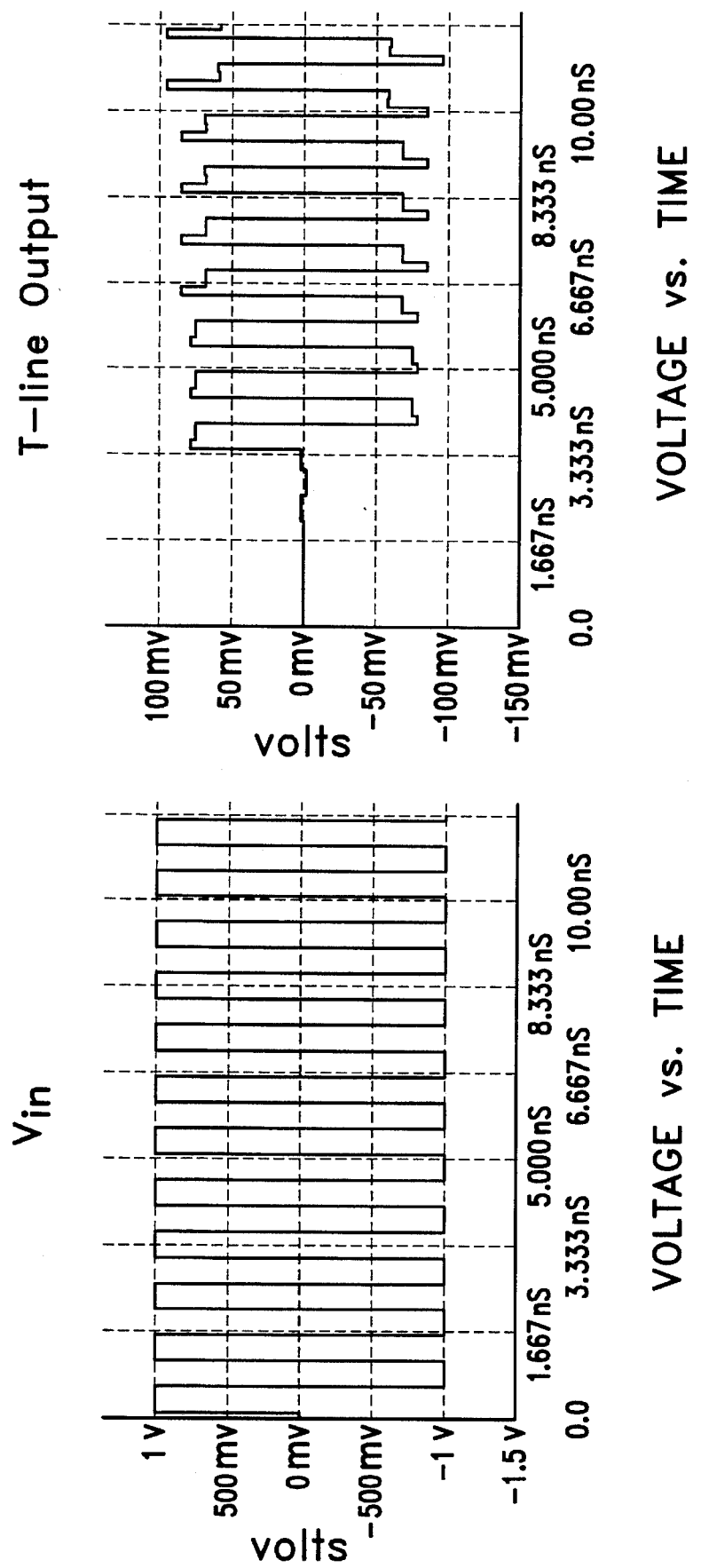
Figures 12A, 12B:
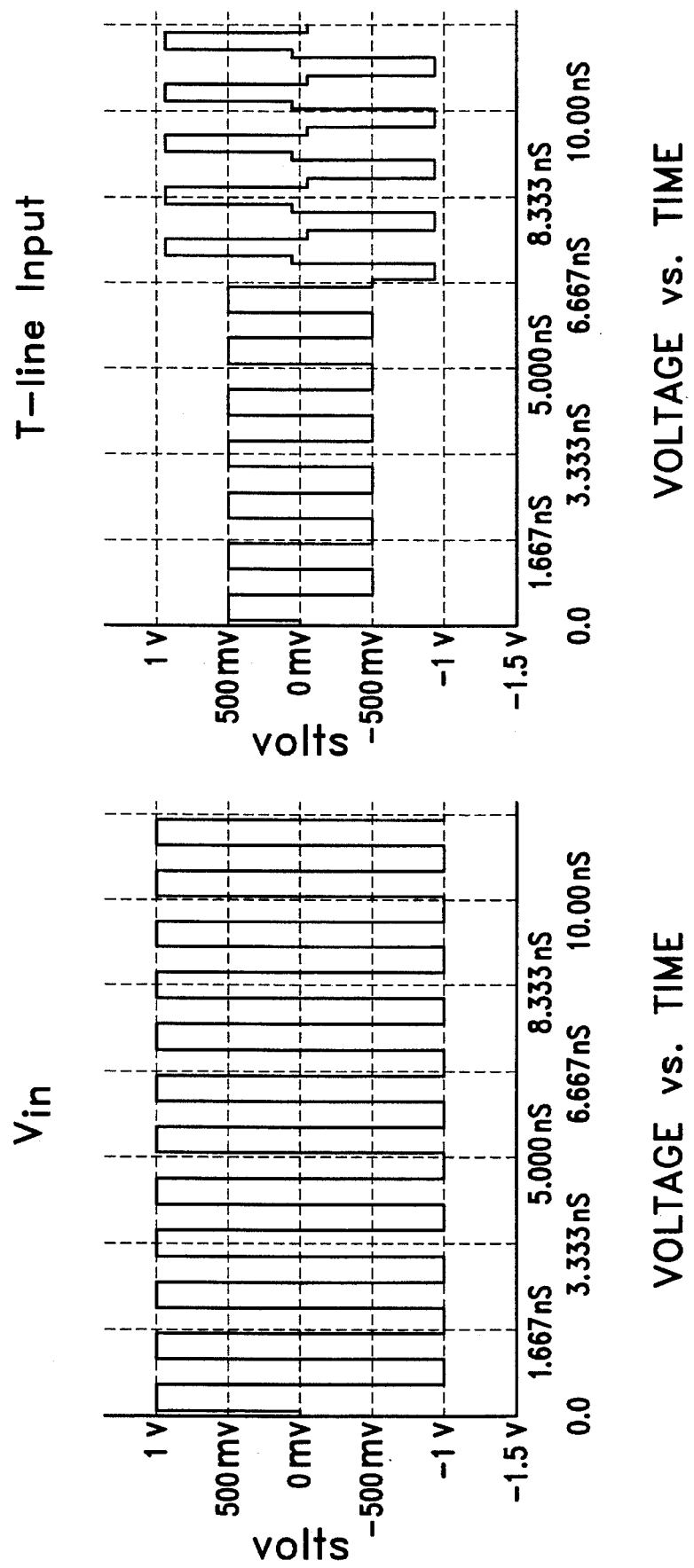
Figures 13A, 13B:
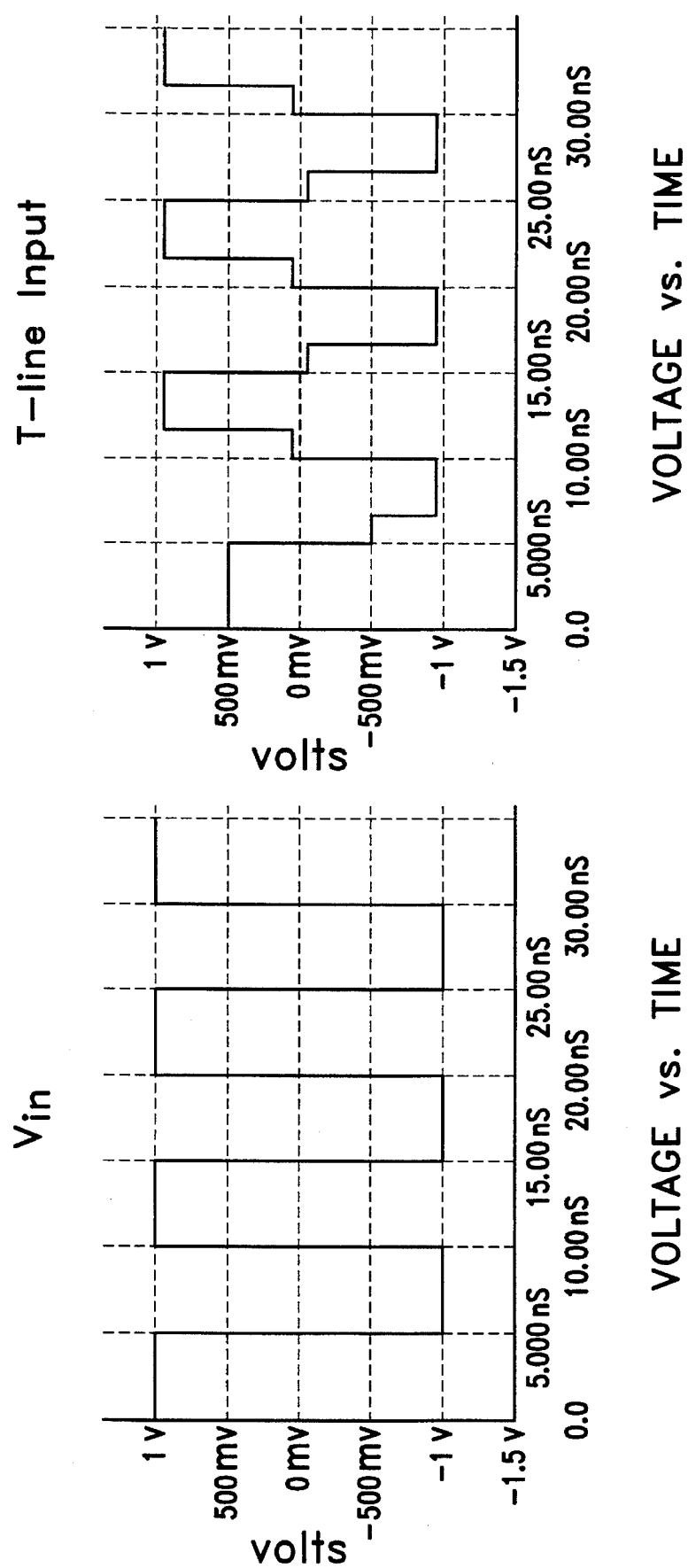
Figures 14A, 14B:
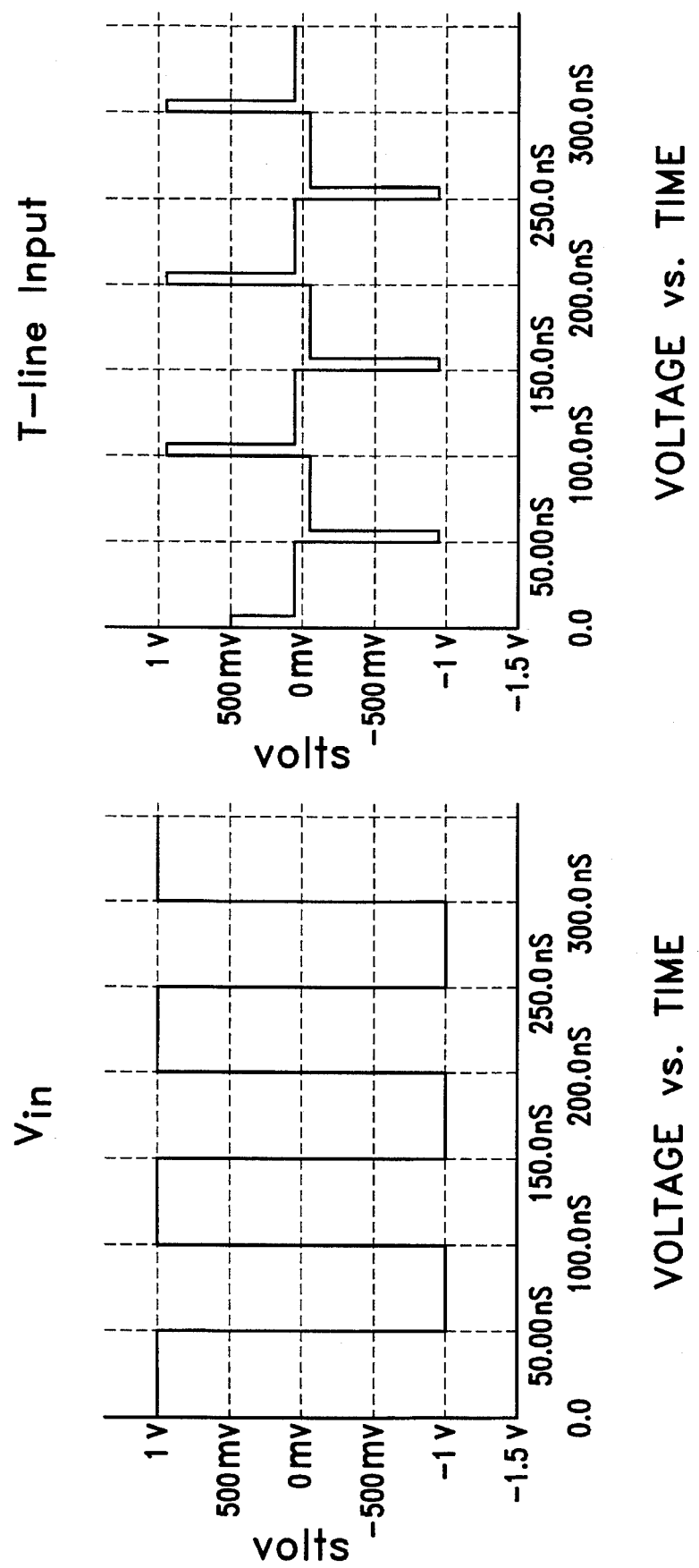

| FIG. No. | $R_0$ value | Input shape | Input freq. | Waveform in FIG. _a | Waveform in FIG. _b |
| --- | --- | --- | --- | --- | --- |
| FIG. 7a, 7b | 50Ω | Square wave | 1 GHz | $V_{in}$ | T-line out |
| FIG. 8a, 8b | 50Ω | Sine wave | 1 GHz | $V_{in}$ | T-line out |
| FIG. 9a, 9b | 45Ω | Square wave | 1 GHz | $V_{in}$ | T-line out |
| FIG. 10a, 10b | 55Ω | Square wave | 1 GHz | $V_{in}$ | T-line out |
| FIG. 11a, 11b | 25Ω | Square wave | 1 GHz | $V_{in}$ | T-line out |
| FIG. 12a, 12b | 50Ω | Square wave | 1 GHz | $V_{in}$ | T-line in |
| FIG. 13a, 13b | 50Ω | Square wave | 100 MHz | $V_{in}$ | T-line in |
| FIG. 14a, 14b | 50Ω | Square wave | 10 MHz | $V_{in}$ | T-line in |

In all of the simulations, a coaxial cable, referred to as "T-line" in the table and drawings, having a characteristic impedance of 50 ohms and a length of 1 meter is selected, and the laser diode is assumed to have a dynamic impedance of 3 ohms.

In the first simulation (FIGS. 7a and 7b), a 50 ohm backmatching impedance is used and the input voltage $V_{in}$ is a square wave at a frequency of 1 GHz. The transmission line (coaxial cable 32) output waveform is a faithful reproduction of the input, except that there is a delay of 3.3 ns, representing the transmission time for the 1 GHz signal to The final simulation (FIGS. 14a and 14b) is similar to the last two described cases, except that the input frequency is further lowered, to 10 MHz. From this simulation, it is observed that, whenever there is a transition (from high to low or vice versa), a wavefront is launched through the transmission line. The wavefront reaches the load and most of it is reflected back, a small percentage being absorbed by the load $Z_L$. When the reflection reaches the input of the transmission line, it tends to cancel the input wave. The result is a narrow pulse at every transition time. The width of the pulse is approximately 6.6 ns, which is the roundtrip propagation time for the transmission line. The dc offset with respect to the zero voltage line is measure of the amount of signal energy absorbed by the load.

Figure 15:
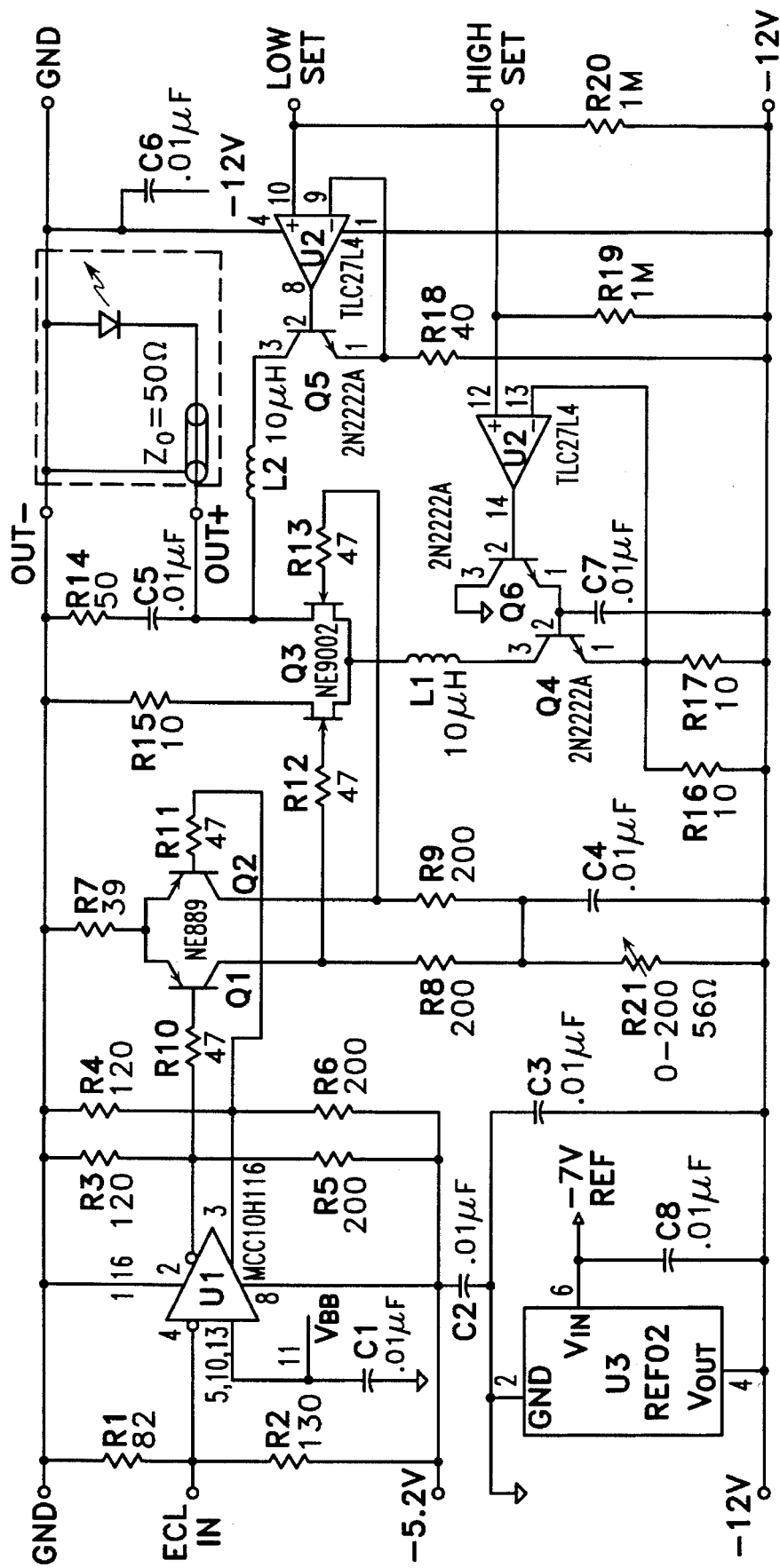
FIG. 15 is a schematic diagram of the drive circuit used in the preferred embodiment of the present invention.

Although various circuit designs could be employed for the laser diode driver, the schematic details of the presently preferred laser diode driver are shown by way of example in FIG. 15. The laser diode 10 is supplied with current through the coaxial cable 32. R14 is the backmatching impedance 42. Transistor pair Q3 (part no. NE9002) is a C-Band, medium power, GaAs MESFET device that can handle up to 550 mA of current. Depending on the state of the data input signal introduced as an ECL (emitter coupled logic) signal on line ECL IN, current through the transistor pair Q3 either flows through the right-hand leg and the coaxial cable to the laser diode 10, or is bypassed through the left-hand leg of the transistor pair. A bias current always flows to the laser diode 10 from transistor Q5. Other components in the driver circuit provide user adjustability of both the bias current and the modulation current.

It will be appreciated from the foregoing that the present invention represents a significant advance in the field of laser diodes, especially as used in communications and other applications using high modulation currents and switching rates. In particular, the invention provides for physical and thermal isolation of the laser diode from its drive circuit, which is a large source of heat. It will also be appreciated that, although one embodiment of the invention has been described in detail for purposes of illustration, various modifications may be made without departing from the spirit and scope of the invention. Accordingly, the invention should not be limited except as by the appended claims.

I claim:

1. Apparatus for driving a semiconductor laser diode at high currents from a drive circuit that is physically and thermally isolated from the laser diode, the apparatus comprising:
   a semiconductor laser diode;
   a drive circuit, for generating current signals to be applied to the semiconductor laser diode;
   a transmission line having input terminals to which the drive circuit is connected and output terminals to which the semiconductor laser diode is connected, the transmission line having sufficient length to provide a desired physical separation of the semiconductor laser diode from the drive circuit, and having a characteristic impedance; and
   a backmatching impedance connected across the input terminals of the transmission line, and having an impedance approximately matching the characteristic impedance of the transmission line;
   whereby use of the backmatching impedance at the input terminals of the transmission line avoids the location of any heat producing components near the semiconductor laser diode, the temperature of which can then be conveniently controlled.

2. Apparatus as defined in claim 1, wherein:
   the semiconductor laser diode has a dynamic impedance of approximately 2–5 ohms in the "ON" state; and
   the transmission line characteristic impedance and the backmatching impedance are each approximately 50 ohms.

3. Apparatus as defined in claim 1, wherein:
   the drive circuit generates a constant bias current that is sufficient to maintain the semiconductor diode in an "ON" state at all times, and generates a modulating current that is added to the bias current in response to presence of a data signal applied to the drive circuit.

4. Apparatus as defined in claim 3, wherein:
   the modulating current is a square wave having a selected radio frequency.

5. A method for operating a semiconductor laser diode in physical and thermal isolation from its drive circuit, the method comprising the steps of:
   connecting a transmission line of selected characteristic impedance between a drive circuit and a semiconductor laser diode, the transmission line having input terminals connected to the drive circuit and output terminals connected to the semiconductor laser diode;
   connecting a backmatching impedance between the input terminals of the transmission line, the backmatching impedance having an impedance approximately matching the characteristic impedance of the transmission line;
   generating bias and modulating currents in the drive circuit; and
   transmitting the bias and modulating currents along the transmission line to the semiconductor laser diode without significant distortion;
   whereby the semiconductor laser diode is isolated from sources of heat in the drive circuit but is electrically matched to its drive circuit.

6. A method as defined in claim 5, and further comprising:
   controlling the temperature of the semiconductor laser diode, to stabilize its operation, whereby temperature control can be more easily effected because the semiconductor laser diode is physically and thermally isolated from its drive circuit.

\* \* \* \* \*